United States Patent [19]

Reed

[11] 4,096,308
[45] Jun. 20, 1978

[54] SCREEN PRINTING MESHES

[76] Inventor: Kenneth James Reed, 33 Carlyle Square, London, S.W.3, England

[21] Appl. No.: 606,051

[22] Filed: Aug. 20, 1975

[30] Foreign Application Priority Data

Aug. 23, 1974 United Kingdom ............... 37184/74

[51] Int. Cl.² .............................................. B41N 1/24
[52] U.S. Cl. .................................. 428/247; 101/128.2; 101/128.4; 427/143; 156/160; 156/161; 156/163; 156/164; 428/248; 428/252; 428/255; 428/256
[58] Field of Search ................. 428/255, 256, 38, 247, 428/409, 248, 252; 101/128.2, 128.4, 128.1; 156/160, 161, 163, 164; 427/143; 96/116

[56] References Cited

U.S. PATENT DOCUMENTS

| 2,353,224 | 7/1944 | Dreyfus | 428/255 |
| 2,353,225 | 7/1944 | Dreyfus | 428/255 |
| 2,592,789 | 4/1952 | Brennan | 101/128.2 |
| 2,957,512 | 10/1960 | Wade | 156/163 |
| 3,255,810 | 6/1966 | Rowbottam | 156/160 UX |
| 3,266,966 | 8/1966 | Patchell | 428/255 |
| 3,297,461 | 1/1967 | Siddall | 428/256 |
| 3,455,367 | 7/1969 | Tarte | 156/160 UX |
| 3,623,937 | 11/1971 | Gasaway | 428/255 |
| 3,900,628 | 8/1975 | Stewart | 428/409 |
| 3,934,503 | 1/1976 | Kinney | 101/128.2 |
| 3,990,929 | 11/1976 | Evans | 156/163 |

OTHER PUBLICATIONS

Albert Kosloff, "Screen Printing Process," pp. 90–93.

Primary Examiner—Ellis Robinson
Attorney, Agent, or Firm—Cushman, Darby & Cushman

[57] ABSTRACT

A laminated assembly comprising a base sheet and a screen mesh laminated thereto in a tensioned state relative to the base sheet is provided. A screen printing screen is made therefrom by fixing the assembly on a screen printing frame and removing the base sheet from the assembly whereby to leave the screen mesh tensioned on the frame. By suitable choice of tension in the assembly screens having uniform and controlled mesh tension values may be produced quickly without previous cumbersome procedures.

18 Claims, 8 Drawing Figures

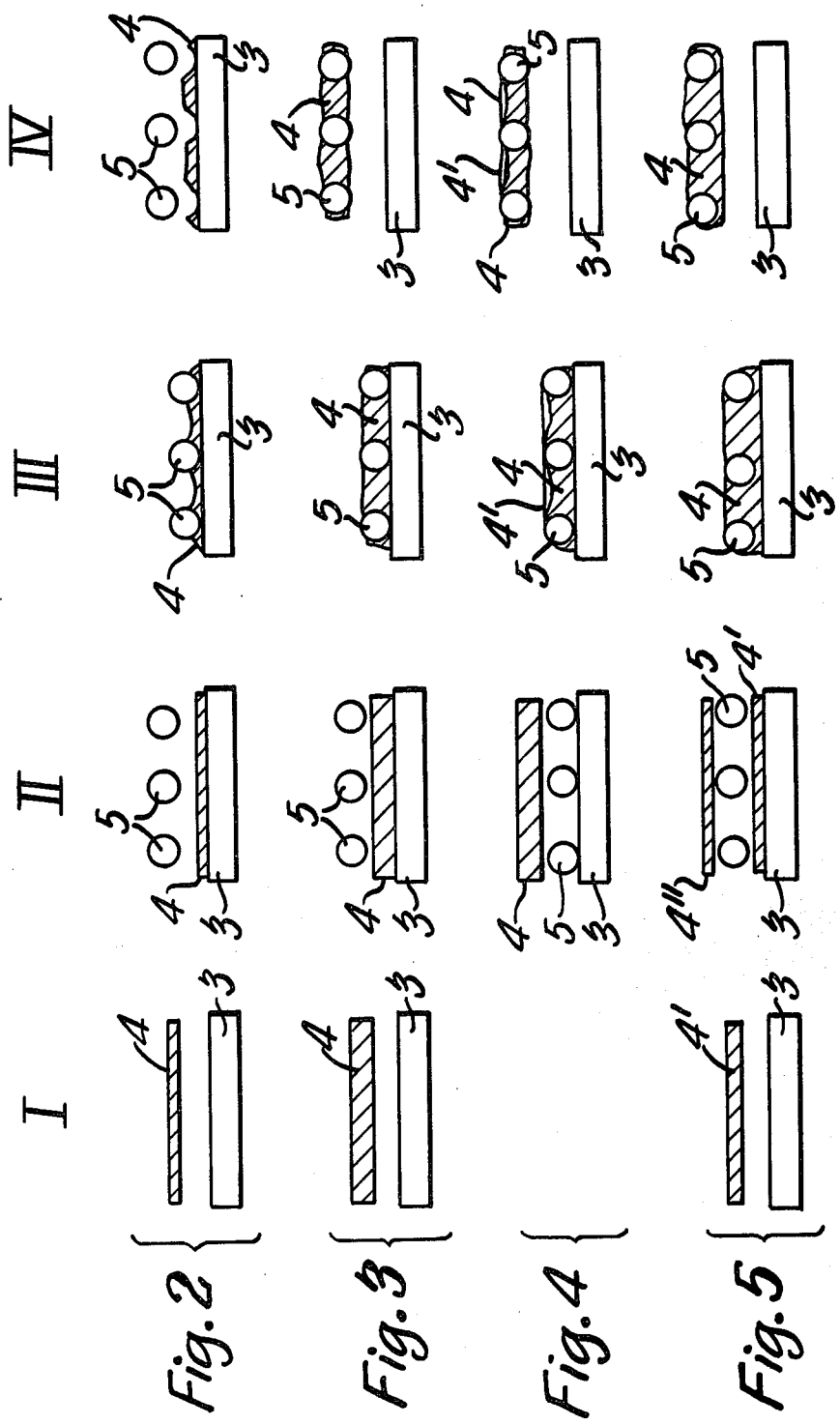

SCREEN PRINTING MESHES

This invention relates to improvements in screen printing meshes.

In the screen printing process, printing ink is caused to flow through apertures of a screen consisting of a mesh fixed under tension to a support frame. The screen mesh constitutes a stencil in which selected mesh apertures are closed off and so ink can pass only through open or partly open apertures which are the printing regions of the screen to form a printed image.

The mesh used in screen printing is usually a woven textile or metal mesh. Preferred textiles are polyester and polyamide and these may be woven from mono-filament or multi-filament yarn. Silk and organdie meshes are also used but to a lesser extent. Stainless steel monofilament mesh is a very useful metal mesh: composite textile and metal meshes are also known, for example a mesh consisting of a layer of metal electrolytically deposited onto a textile mesh.

In use, the meshes are fixed to a screen frame under tension prior to application of the printing stencil. Uniform mesh tension throughout the screen area with specific tension values in warp and weft directions is essential for high print quality and screen life. Incorrect or uneven tension causes a variety of problems such as loss of print dimensional accuracy and consequent loss of print register in multicolour printing; variable ink thickness due to variation in mesh aperture with tension variations, poor print sharpness due to excessive or non-uniform mesh movement in the printing cycle particularly in off-contact printing techniques, reduced stencil life, and mesh splitting.

The correct tensioning of mesh for the preparation of screens has required special purpose tensioning apparatus. A variety of such apparatuses are known, and there are used variously, mechanical, pneumatic and hydraulic means to apply the tensioning force by means of numerous clamps, to the mesh edges. Such apparatuses are generally expensive and require considerable operator skill and the mesh tensioning operation is lengthy and tedious. The mesh is fixed to the screen frame by either an adhesive or mechanical fixing, the mesh tensioning force is disconnected (after removal of the clamps and the adhesive has set when an adhesive is used), and the excess mesh trimmed off the frame. The area of mesh required is substantially greater than the area of the screen frame since the numerous clamps require an overlap to grip the mesh on four sides. This is wasteful of the expensive mesh. Having prepared the screen, the stencil is then applied as a separate operation, and this involves further time and very considerable skill, particularly when photo-stencils are used.

Each type of mesh filament and mesh weave requires specific tension values in both warp and weft directions for optimum printing performance and screen life. In fact each batch of woven mesh requires fine adjustment to tension values. Tension values are usually assessed in the prior art either by measurement of % mesh elongation in the tensioning operation, or by measuring mesh tensioning force (kg/cm) applied to the mesh edges in the tensioning apparatus. With the increased speeds of screen printing, the greater use of very fine meshes of 90–150 threads per centimeter, and the demand for increased print quality, the mesh tensioning apparatuses and processes of the prior art do not provide the required accuracy of mesh tension in warp and weft directions, and no allowance can be made for the batch to batch variations in mesh mechanical properties, and dissimilarity of warp and weft properties.

According to the present invention there is provided a laminated assembly comprising a base sheet and a screen mesh laminated thereto in a tensioned state relative to the base sheet.

Such an assembly can be fixed to the screen frame without tensioning so that when the laminating base sheet is delaminated the mesh immediately develops a tensioned state on the screen frame. By suitable choice of the tension in the assembly of the present invention, screens having uniform and controlled mesh tension values, may be produced in this way quickly, without the use of mesh tensioning apparatus and by an operation requiring minimal skill. Accordingly the invention also provides a process for making a screen printing screen which process comprises fixing an assembly according to the invention on a screen printing frame without tensioning the said assembly and removing the base sheet from the assembly whereby to leave the screen mesh tensioned on the frame.

With the present assembly there need be only minimum wastage of mesh because the area of laminated mesh used may be exactly that of the screen frame since no overlap of mesh for clamping in a tensioning apparatus is required. Unused areas of laminated tensioned mesh may be rolled up and used for preparing smaller screens.

The laminated assembly of the present invention may be prepared by tensioning a screen mesh and laminating to the screen mesh while in its tensioned state untensioned base sheet material. The laminated assembly may be manufactured in individual lengths or in continuous form and may conveniently be stored by winding up into rolls if the base sheet is flexible.

The mechanism of making an adhesively laminated tensioned mesh of the present invention is as follows: When mesh is tensioned, the warp and weft filaments physically elongate and this causes the mesh apertures to expand in size. The elongation range in the normal tensioning of textile meshes is 1–7% depending on the type of mesh filament, filament diameter and number of filaments per centimeter in warp and weft directions. According to the present method the mesh filaments are maintained in a correctly elongated condition with the mesh apertures similiarly expanded, while adhesive, which partly or totally encapuslates the mesh and is in contact with the laminating base sheet, is allowed to set to a hard condition.

In the manufacture of screen mesh a considerable number of factors determine the mechanical properties of the final mesh. These include filament composition, diameter, frequency, and weaving tensions and mesh heat treatment processes used after weaving to stabilise the mesh. Each batch of mesh will therefore have differing mechanical properties, in particular different stress/strain curves which can be obtained on a tensile testing apparatus. From this curve the % elongation to give optimum screen printing properties and screen life can be determined. Optimum % elongation may be different for warp and weft directions. Each batch of mesh can therefore be laminated, according to the present invention, with the optimum "frozen" tension values in warp and weft directions.

Mesh tension "frozen" in a laminated assembly according to the invention can only be lost if the mesh filaments physically move relative to the laminating sheet to reduce the size of the mesh apertures. This movement would require shearing of the adhesive either at the base sheet/adhesive interface, or at the mesh-/adhesive interface, or within the body of the adhesive. Laminating adhesives for use in the present invention should therefore have shear strengths sufficiently high to withstand the shearing force of the tensioned mesh. The shearing force is generally equal to the force originally required to tension the mesh which is in the range of $\frac{1}{2}$–5 kg/cm mesh edge in warp and weft directions and it is believed that the shearing strength of the adhesive formulations used in the present invention and described in more detail below are at least an order of magnitude ($\times$ 10) higher than this.

It is desirable to select laminating adhesives which are free from adhesive creep properties so that there is no slow flow of the adhesive over a period of time when subjected to a continuous force. It is possible to select adhesives which are creep resistant as well as shear resistant so that the laminated tensioned mesh is highly stable; accelerated ageing tests should indicate that there should be no significant loss in tension for periods of years. The stability of conventional mesh is actually improved by the laminated mesh of the present invention because when the mesh filaments are encapsulated, they are protected from the atmospheric degradation, e.g. hydrolysis and oxidation, and in addition the relatively fragile screen mesh is protected from mechanical damage including abrasion and creasing. The laminated mesh may conveniently be stored in rolls with the laminating support outermost where it affords complete mechanical protection. It is a valuable advantage of the present invention that mesh prior to lamination may be degreased and chemically or mechanically etched in bulk for stencil adhesion. The laminating adhesive thereafter protects this special mesh surface from contamination.

The adhesive in the present laminated assembly may partly or wholly encapsulate the filaments of the tensioned mesh. Whether partial or whole encapsulation is chosen depends in part on the intended end use of the assembly. With partial encapsulation there may be produced an assembly in which on dry delamination (i.e. peeling off of the backing sheet), the adhesive is retained on the backing sheet to leave the mesh completely uncoated with adhesive in a single dry step. Alternatively delamination may be wet by dissolving away of the adhesive with water or an organic solvent depending on the adhesive used. Again a screen mesh free of adhesive is obtained.

Whole encapsulation with adhesive can of course fully protect the mesh filaments of the assembly from atmospheric damage and mechanical damage. Dry delamination of such an assembly will leave a mesh bearing the adhesive coating in tact. The adhesive may be removed by wet delamination using water or an organic solvent to dissolve it away.

Further if a paper-based base sheet which is permeable to water is employed, delamination may be carried out by application of water to the back of the sheet leaving the coating in tact on the mesh.

An important advantage of the laminated assembly of the present invention is that there may be used as laminating adhesive an adhesive having the dual functions of laminating adhesive and integral photostencil coating. In this case after delamination of the laminated assembly to form the screen in accordance with the invention the adhesive, which is photosensitive or photosensitizable, is retained on the tensioned mesh to form the complete photostencil layer. In use such photostencil layers are presensitized if necessary and then only require exposure and development to provide a printing screen complete with photostencil. If pre-sensitization is required this may be achieved for example by application of a solution of sensitizer. Sensitizers which may be used include dichromate salts, diazonium salts and couplers for diazonium salts.

Of course if the laminated assembly of the present invention contains adhesive which is photosensitive, the laminating operation for its production is carried out in safe-lighting, usually non-actinic yellow light, and the final laminated assembly is stored away from actinic light.

It is to be noted that when the laminating adhesive is retained in the delaminated mesh in this way to provide an integral photostencil layer, the dry adhesive may slightly reduce the transmission of full tension to the screen frame. However, when the dry adhesive is treated with sensitising solution, this softens the adhesive which then allows full tension to be transmitted to the screen. Consequently, when this is exposed to the photographic positive and developed in water the mesh is in a stable condition and the photostencil will correctly register with the original positive.

Similarly, if slight residual tension is retained by the adhesive of a pre-sensitized mesh after removal of the base sheet, this residual tension may be released by moistening the screen e.g. with water or a alcohol-water mixture to soften the adhesive. Generally the adhesives used for presensitized mesh are sufficiently flexible not to retain tension on removal of the base sheet.

After applying a photostencil to a screen prepared by a conventional process, it is necessary to seal with screen filler the entire screen area outside the photostencil area to prevent passage of ink. This is a time consuming operation. However in screens prepared by the present invention no screen filling at all need be required because the entire screen area is covered with the adhesive and it is arranged that when exposing the positive that this area outside the photostencil area also receives a light exposure and thus the adhesive will be retained in the mesh.

It is a surprising feature of the present invention that relatively thin and flexible base sheets will maintain mesh in a highly tensioned state. For example, plastics, paper-based or composite sheet materials with thickness of 75–750 micrometers are generally suitable. Base sheets 125 to 250 micrometers thick are preferred. Such thin sheets have the advantage that they are so flexible that they can be rolled up onto small cores of for example 5 cm diameter. Such rolls of laminated mesh can thus be stored in a very compact form.

The base sheet is however subject to compressive forces in the laminated assembly of the present invention. To resist these compressive forces the most suitable materials for base sheets are plastics or cellulosic (paper-based) materials, or composites thereof, all with high compression modulus. Suitable plastics films for use as base sheet are of polyester, polyvinyl chloride (preferably unplasticised), polyamide, polyimide, polycarbonate and polystyrene (preferably unplasticised), especially polyester, polystyrene or polyvinyl chloride. Suitable paper-based sheets are dense, calendered paper which may also be treated with stiffening polymer such as melamine formaldehyde. Paper-based sheets may also be surface coated with a polymer or laminated to a plastics film or metal foil to modify the surface adhesive preperties or increase the compression modulus.

All base sheets will compress a finite amount when subject to mesh tension forces. However, the amount of compression is generally very small. For example, assuming that the moduli of elasticity of the mesh material and base sheet material are equal, the cross-sectional area of the base sheet may easily be 10 times larger than that of the total cross-sectional area of the mesh filaments and base sheet compression will cause a loss of mesh elongation of 10%, i.e. reduced from e.g. 3% to 2.7%. This effect can be easily compensated for by increasing the original laminating mesh tension by 10% e.g. to 3.3% elongation during the preparation of the laminated mesh. In practice it is found that predetermined tension values of the mesh on the screen frame can be consistently predicted and that the uniformity and accuracy of tension are far superior to those obtained in practice by the conventional tensioning apparatus and tensioning method.

Due to the "frozen" mesh tension forces and the generally flexible nature of the base sheet, flat sheets of laminated mesh generally coil up immediately if not restrained. When a sheet of laminated mesh is required for screen production the required length is simply unwound from the roll and taped or pinned to a flat table. The laminated mesh is thus easily kept flat while the screen frame is attached to it by adhesive or mechanical fastening prior to removal of the backing sheet to form the screen.

As the backing sheet is removed (e.g. by mere peeling off), the tension forces when the mesh is "unfrozen" are transmitted to the screen frame and may cause inward bowing of the frame members, particularly with large frames of low stiffness. This reduces slightly the mesh tension but such reduction of mesh tensioned can be avoided by pre-stressing the screen frame.

The invention is further illustrated by way of example in the accompanying drawings wherein:

FIGS. 2 to 5 illustrate schematically different forms of laminated assembly of the present invention.

Figure 1:
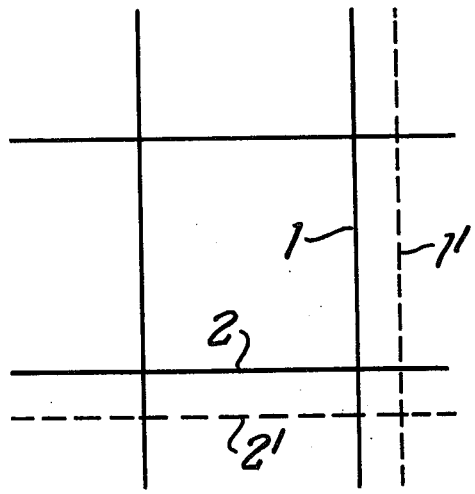
FIG. 1 illustrates mesh filament elongation under tension.

Referring first to FIG. 1 this shows part of a screen mesh. The positions of the mesh filaments 1 and 2 in the untensioned state are shown in solid line while the positions of the elongated filaments under tension are shown in dotted line at 1' and 2' respectively. As can be seen this elongation causes expansion of the mesh apertures.

FIGS. 2 to 5 illustrate schematically different forms of laminated assembly of the present invention. The forms are illustrated with reference to four process steps: Step I-provision of base sheet and adhesive; Step II-lamination; Step III-laminated assembly; Step IV-delamination. In FIGS. 2 to 5 like parts are given like reference numerals.

Referring first to FIG. 2, there is illustrated formation of a laminated assembly in which the mesh filaments are only partly encapsulated with adhesive. In Step I there is provided a base sheet 3 and a thin layer of adhesive 4. In Step II the adhesive 4 is applied to the base sheet 3 and to this is applied the tensioned screen mesh shown diagrammatically by three filaments 5. The adhesive is set to form the laminated assembly of Step III in which the adhesive 4 is such that it only partly encapsulates the filaments of the mesh. Delamination, i.e. removal of the base sheet 3, after fixing the laminated assembly to a screen frame (Step IV) may be by dry delamination to leave a completely uncoated mesh 5 as shown in the Figure. Alternatively delamination may be wet by dissolving away of the adhesive with water or an organic solvent depending on the adhesive used. In this way screen mesh which is free of adhesive is obtained.

Referring to FIG. 3, the laminated assembly is formed in a manner similar to that of FIG. 2 but in this case the mesh filaments of the assembly are fully encapsulated by the adhesive. Thus in Step I there is provided the base sheet 3 and with a relatively thick layer of adhesive 4 such that when coated on the base sheet and the tensioned mesh 5 applied (Step II) the mesh is fully encapsulated by the adhesive. This is shown in Step III where encapsulation after setting of the adhesive is shown. Delamination (Step IV) may leave a mesh in which the filaments are still encapsulated.

According to FIG. 4 a laminated assembly is formed in which again the mesh filaments may be fully encapsulated by adhesive. Thus mesh is prepared (Step II) by coating adhesive 4 on to the surface of mesh 5, while held under tension in contact with the base sheet 3. The adhesive is set to form the fully encapsulated assembly (Step III). If the thickness of adhesive 4 is such as not fully to encapsulate the mesh and full encapsulation is required, it is possible to apply one or more further adhesive layers (as shown by 4'), with intermediate drying of the adhesive. The amount of encapsulation depends on the intended final use of the screen. Delamination by dry stripping, as shown in Step IV, at the laminating sheet surface will leave the coating intact on the mesh which is then in ideal form for photostencil production. Alternatively (or additionally) wet delamination, in which water or an organic solvent is used to wash the adhesive coating off the mesh, may be employed. A paper-based base sheet which is permeable to water allows delamination to be carried out by application of water to the back of the sheet leaving the coating intact on the mesh. It will be appreciated that these delmaination techniques may also be applied in the case of the laminated assembly of FIG. 3.

FIG. 5 illustrates the formation of a laminated assembly in which not only are the mesh filaments fully encapsulated but also a further adhesive layer is applied. Thus, in Step I, a first adhesive layer 4' is applied to the base sheet 3 and dried. The resulting material is then, in Step II, laminated to the mesh 5 while the latter is under tension and while an additional adhesive coating 4" is applied to the outer surface of mesh 5. The adhesive is set to form the laminated assembly of Step III. As with the mesh of FIG. 4 dry or wet delamination may be carried out. In Step IV is illustrated delamination to leave adhesive intact on the mesh.

The laminating adhesives used may be of three main types those set by evaporative drying, those set by curing and those set by cooling (thermoplastic). Adhesives which are set by evaporative drying may be water or solvent based and in the laminating operation the mesh is kept in the tensioning apparatus while the adhesive is drying and until it is set. These adhesives are particularly suitable for laminating fully encapsulated mesh according to FIG. 4 and encapsulated mesh plus adhesive layer according to Step II of FIG. 5. They are also suitable for use in the coating of Steps I of FIGS. 2, 3 and 5 and so will provide all three types of laminated mesh. With this type of adhesive, mesh laminating is carried out while the adhesive is still wet and soft. Adhesives of this type may also have photosensitive or photosensitizable properties to give a laminated assembly with integral photo-stencil layer. Delamination of this class of adhesive may be carried out dry or wet depending on the precise adhesive composition.

Adhesives which are set by curing, particularly radiation curing, such as ultra violet or electron beam curing, have the particular advantage of extremely short setting times of the order of a second so that in the laminating operation extremely fast rates of production are possible.

Adhesives which set by cooling, i.e. thermoplastic adhesives, are particularly useful in Steps I according to FIGS. 2 and 3. Delamination may be carried out dry or wet depending on the adhesive composition and the delaminated mesh of Step IV of FIG. 3 may be photosensitive if an appropriate adhesive is used.

Figure 6:
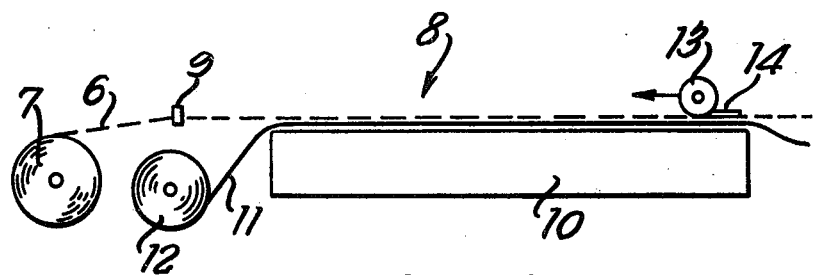
FIGS. 6 and 7 illustrate different apparatuses suitable for forming the assembly of the present invention.

As mentioned above the laminated assembly according to the invention may be produced in separate sheet or continuous form. Suitable apparatus for the production of separate sheets is illustrated in FIG. 6. Referring to FIG. 6, screen mesh 6 is drawn from a roll 7 and tensioned on a pin stenter 8 which consists of two transverse pin clamp bars 9 (only one shown) for warp tension and longitudinal pins along each side for weft tension. The mesh tensioning is carried out over a support table 10 over which there is provided base sheet material 11 drawn from a roll 12. The mesh is tensioned in the warp and weft directions making due allowance for compression of the base sheet, in contact with the base sheet. The upper surface of the mesh 6 (while under tension) is coated by means of an adhesive coater 13 travelling across the upper mesh surface in the direction indicated by the arrow while the base sheet 11 is held in light pressure contact with the lower mesh surface to provide an adhesive coating 14. The adhesive is set and then the resulting laminated sheet is removed from the apparatus and reeled up for storage. The base sheet 11 used in this method may be uncoated or pre-coated (with adhesive) depending on the type of encapsulation required.

The adhesive coater used in the above apparatus may for example be a doctor blade, a rotating rubber roller, a wire wound metal roller, a metal roller with circumferential machined grooves or a metal gravure roller.

Figure 7:
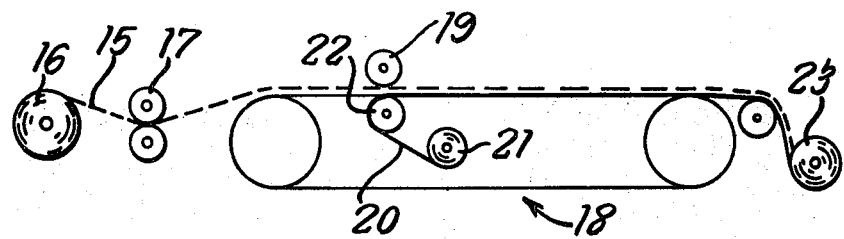

Suitable apparatus for use in the production of the assembly of the present invention in continuous sheet form is illustrated in FIG. 7. Referring to FIG. 7, screen mesh 15 is drawn from a mesh roll 16 through the nip of two warp tensioning rolls 17 of a pin stenter 18 which tensions the mesh in both the warp and weft directions. When the required warp and weft tension is built up on the pin feed laminating adhesive is coated on the upper surface of mesh 15 from an adhesive coater 19 while base sheet material 20 from a roll 21 is applied to the lower mesh surface by means of a single rubber roll 22 which serves both as the laminating roll and backing roll for the coating operation. As before sheet may be uncoated or pre-coated depending on the type of encapsulation required.

As the mesh, still under tension, and backing sheet traverse the stenter 18 the adhesive coating is set for example by evaporative drying in a jet drier. The applied tension is of course chosen so as to make due allowance for tension loss by compression of the base sheet. The laminated assembly produced is then withdrawn from the stenter 18 and rolled up on roll 23 for storage.

Figure 8:
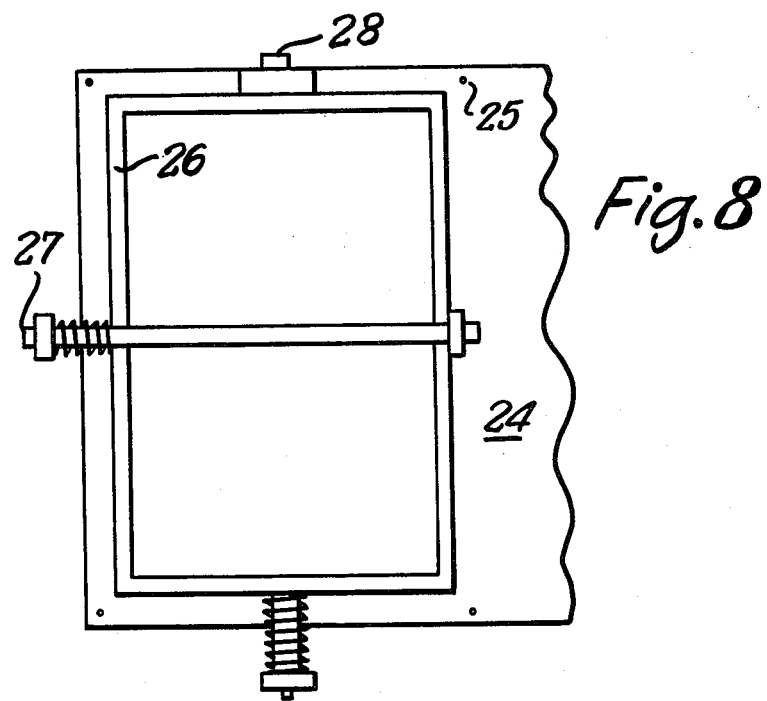
FIG. 8 illustrates the production of a screen mesh according to the invention.

FIG. 8 illustrates the production of a screen mesh from the laminated assembly of the present invention.

Referring to FIG. 8 a sheet of laminated assembly 24 according to the invention from a roll is secured by means of pins 25 to a table with the mesh side facing upwards. Alternatively if preferred the assembly may be taped to the table. The table may be covered with a rubber blanket to absorb irregularities in the table's surface.

A wood or metal frame 26 is stressed by means of two pre-stressing clamps 27 and 28 between opposing pairs of sides of the frame and at right angles to each other. Clamps 27 and 28 are shown with springs but it will be appreciated that other forms of pre-stressing e.g. by use of pneumatic pressure may also be used. The correct clamping pressure acting inwards can be pre-determined and the clamps calibrated e.g. by movement of a spring or the use of pneumatic pressure.

Bonding adhesive, such as a quick setting catalysed epoxy resin adhesive, is coated over one face of frame 26 and frame 26 is pressed down on to the secured laminated assembly 24. Pressure is maintained until the adhesive is set and then the frame (and assembly) is removed from the table and cut off from the laminated assembly roll. The backing sheet is removed and the pre-stressing clamps released. The final bowing of the screen frame due to mesh tension should be equal to the amount of bowing caused by the pre-stressing. There will be no net effect on the mesh tension and mesh tension on the screen will be exactly that "frozen" into the laminated mesh. In practice the magnitude of mesh tension loss caused by not pre-stressing is very small and can be ignored except in special cases.

The invention is further illustrated in the following Examples.

EXAMPLE 1

Polyester monofilament mesh which has been degreased and chemically or mechanically etched and having 100 filaments per centimeter in warp and weft directions with a filament diameter of 40 micrometers, the mesh filaments being antihalation dyed, is tensioned on a pin stenter as in FIG. 6 to give a warp elongation of 1.8% and a weft elongation of 1.6%. The length of mesh tensioned is 7.5 meters and the width 1.5 meters which equals the full woven width of the mesh.

Mesh tensioning is carried out in a horizontal plane above a flat support table on which there has been unwound base sheet material with length and width equal to the mesh, from the base sheet stock roll. This sheet consists of unplasticised pigmented, orientated polyvinyl chloride film of 200 micrometers thickness having a smooth matt surface and having a very high compression modulus.

The laminating adhesive which may be set by evaporative drying used consists of:

| | | |
|---|---|---|
| Polyvinyl alcohol | 9.54 | parts by weight |
| Polyvinyl acetate emulsion 50% solids | 20.48 | |
| Water | 69.96 | |
| Blue Pigment | 0.02 | |
| | 100.00 | |

The blue pigment is incorporated to render the adhesive clearly visible. This adhesive is coated on the upper mesh surface to encapsulate the mesh according to Step II of FIG. 4. The adhesive has about 20% solids by volume and the coating thickness is regulated so that the dried adhesive will fully encapsulate the mesh and give an upper surface (squeegee side of the mesh) which ehibits only small deviations from flatness due to mesh texture. Although it is possible to achieve this degree of encapsulation in one coating operation, it is also possible to use two or more coating applications, with intermediate drying of the adhesive. The amount of encapsulation depends on the final use of the screen. If the laminating adhesive is to be removed from the screen by washing-out with water, then it is unnecessary fully to encapsulate the mesh. If the laminating adhesive is to serve the dual function of adhesive and photostencil layer then full encapsulation is desirable to provide maximum photostencil adhesive to the mesh and maximum print run. The alternative conditions are both illustrated in Steps III and IV of FIG. 4.

The coating applicator mechanically tranverses the full length of the mesh and side dams are used to limit the width of the coating to about 5 mm from the mesh edges so that all the mesh except the selvedge is coated. Doctor blade or rotating rubber roller coating are suitable for applying the adhesive when relatively thin multiple coatings are used, but if the adhesive is applied in one operation a wire wound metal roller, metal roller with circumferential machined grooves, or a metal gravure roller is preferred. A resilient layer is required beneath the laminating sheet on the support table to give uniform coating when using metal coating rolls and this consists of a foam rubber blanket of 5mm thickness.

Evaporative drying of the adhesive is carried out rapidly by applying jets of warm air at 50° C to the mesh surface from overhead jet plenums. The tension is maintained during the drying operation.

When the adhesive is set (dry) one transverse clamp bar of the pin stenter is removed and the laminated assembly is reeled up tightly on a small (5cm) core, and lifted off the longitudinal pins as reeling-up is carried out. Finally the second transverse clamp bar is removed and the laminated assembly cut from the mesh and base sheet.

The laminated assembly so obtained can be dry delaminated and the base sheet has a peel bond of 150–200 grams/cm to the mesh and delamination occurs at the base sheet surface as in Step IV of FIG. 4.

EXAMPLE 2

For preparation of a tensioned screen a length of the laminated assembly of Example 1 is unwound from the roll and taped, mesh side up, to a table (see FIG. 8), which may be covered with a rubber blanket to absorb any irregularities in the flatness of its surface. One face of a wood or metal screen frame is coated with a quick setting catalysed epoxy resin adhesive, and pressed down onto the laminated assembly. Pressure is maintained until the adhesive is set (5 minutes) and then the frame is cut apart from the roll of laminated material. When the backing sheet is simply peeled from the screen, mesh tension is instantaneously developed on the screen frame.

The laminating adhesive which has been retained in the mesh may be washed-out with water spray to leave the mesh clean and free from grease and dirt contamination. Since the original mesh has received a chemical or mechanical etch treatment before lamination, the mesh is now in a perfect condition to receive a stencil and the laminating adhesive has served the important function of complete chemical and mechanical protection of the mesh surface.

The tension of the prepared screen is evaluated by measurement of mesh deflection with a transducer, when a force is applied in various positions normal to the screen. Alternatively if register lines are ruled on the original mesh while this is in a taut, but nonelongated condition on the pin tensioning apparatus, the % elongation in warp and weft directions can be followed during all stages namely in the original tensioning on the pin stenter, in the laminated assembly when removed from the tensioning apparatus, and on the screen after delamination.

The mesh tension to the final screen corresponds to an elongation of 1.6% warp and 1.5% weft and these are the optimum values for the mesh used.

EXAMPLE 3

The laminating adhesive of the assembly of Example 2 is photosensitized by treatment with a dichromate salt. To utilise the very valuable feature of the laminated pre-tensioned mesh with integral photo-stencil layer, the laminating adhesive in the screen prepared according to Example 2 is not washed-out with water, but is sensitized to light by treatment with a solution consisting of:

| | | |
|---|---|---|
| Sodium Dichromate | 16.0 | parts by weight |
| Water | 16.0 | |
| Ethanol (90%) | 68.0 | |
| | 100.0 | |

This solution is applied to both sides of the adhesive containing screen and the sensitizing solution is rapidly absorbed by the screen and the excess is removed with a rubber squeegee or sponge. This operation is carried out in safe-light such as yellow light free from blue light and near ultra violet. The dry screen is exposed in a vacuum exposure frame to a photographic positive using a 2Kw mercury halide lamp at 1 meter for 4 minutes. The screen is developed with a high pressure cold water spray to wash out the unexposed laminating adhesive, dried, and this yields an extremely sharp photostencil which produces remarkably long print runs.

The outstanding photostencil sharpness is partly due to the original mesh being anti-halation dyed rather than natural white.

I claim:

1. A laminated screen printing assembly for use in making a screen printing frame comprising a flexible base sheet and a woven textile screen mesh in a tensioned state relative to the base sheet, the base sheet and screen mesh being removably laminated together by means of adhesive such that the mesh is maintained in the tensioned state on the base sheet and that, on fixing the laminated assembly to a screen printing frame and removal of the base sheet, the mesh develops tension relative to the screen frame to provide a printing screen.

2. An assembly according to claim 1 wherein the filaments of the screen mesh are wholly encapsulated by laminating adhesive.

3. An assembly according to claim 2 wherein the base sheet and screen mesh are laminated together by an adhesive capable of photosensitisation.

4. An assembly according to claim 2 wherein the base sheet and screen mesh are laminated together by means of a photosensitive adhesive.

5. An assembly according to claim 1 wherein the base sheet may be removed from the screen mesh by dry delamination.

6. An assembly according to claim 1 wherein the base sheet may be removed from the screen mesh by moistening the assembly with water or an organic solvent to soften or dissolve adhesive laminating the base sheet and screen mesh together.

7. An assembly according to claim 1 wherein the base sheet is 75 to 750 micrometers thick.

8. An assembly according to claim 7 wherein the base sheet is a flexible sheet of plastics, cellulosic material or combinations thereof.

9. An assembly according to claim 8 wherein the base sheet is formed of a polyester, polystyrene or polyvinylchloride film.

10. An assembly according to claim 1 which has been formed by tensioning a screen mesh and laminating the base sheet in untensioned state thereto while the screen mesh remains in a tensioned state.

11. An assembly according to claim 10 wherein the linear extension of the mesh in the assembly is 1 to 7% in both machine and cross-directions.

12. A process for making a screen printing screen which comprises: fixing to the edges of a screen printing frame the mesh side of a laminated assembly without applying any appreciable tension to the assembly, the assembly comprising a flexible base sheet and a woven textile screen mesh in a tensioned state relative to the base sheet, the base sheet and the screen mesh being laminated together such that the mesh is maintained in the tensioned state on the base sheet; and removing the base sheet from the mesh so that the mesh remains tensioned on the frame.

13. A process according to claim 12 wherein the removal of the base sheet leaves adhesive on the screen mesh.

14. A process according to claim 13 wherein the adhesive is photosensitive or is thereafter photosensitised by the addition of a dichromate salt solution, a diazonium salt solution or a coupler for a diazonium salt.

15. A process according to claim 12 wherein the screen frame is stressed prior to fixing the assembly thereon.

16. A flexible laminated screen printing sheet for making a printing screen, said laminated sheet comprising a flexible base sheet and a woven textile mesh tensioned relative to the base sheet in the warp and weft directions of the mesh, the base sheet and the mesh being laminated together by means of an adhesive which at least partially encapsulates the warp and weft elements of the mesh and which has a shear strength sufficient to resist the shearing force applied thereto by the tensioned mesh, the base sheet and adhesive being coextensive with the mesh and the base sheet maintaining the mesh in tension by resisting the compressive force transmitted thereto through the adhesive by the tensioned mesh, the base sheet being delaminatable from the tensioned mesh so that upon fixing a screen printing frame to the mesh side of the laminated sheet the base sheet can be removed from the tensioned mesh to leave the latter in tension relative to the frame.

17. A process for making a screen printing screen which comprises fixing to the edges of a screen printing frame the mesh side of a laminated assembly without applying any appreciable tension to the assembly, the assembly comprising a flexible base sheet and a woven textile mesh tensioned relative to the base sheet in the warp and weft directions of the mesh, the base sheet and the mesh being laminated together by means of an adhesive which at least partially encapsulates the warp and weft elements of the mesh and which has a shear strength sufficient to resist the shearing force applied thereto by the tensioned mesh, the base sheet and adhesive being coextensive with the mesh and the base sheet maintaining the mesh in tension by resisting the compressive force transmitted thereto through the adhesive by the tensioned mesh, the base sheet being delaminatable from the tensioned mesh; and removing the base sheet from the tensioned mesh so that the latter remains tensioned relative to the frame.

18. A method of making a flexible laminated screen printing sheet comprising tensioning in the warp and weft directions a woven textile mesh and laminating the tensioned mesh to a relatively untensioned base sheet by means of an adhesive which has a shear strength sufficient to resist the shearing force applied thereto by the tensioned mesh and which renders the base sheet subsequently removable from the mesh, the base sheet and adhesive being coextensive with the mesh and the base sheet maintaining the mesh in tension by resisting the compressive force transmitted thereto through the adhesive by the tensioned mesh.

* * * * *